United States Patent
Yang et al.

(10) Patent No.: US 8,857,501 B2
(45) Date of Patent: Oct. 14, 2014

(54) ENTRAINMENT HEAT SINK DEVICES

(75) Inventors: Wei Yang, Morristown, NJ (US);
Leonard Hilton, Morristown, NJ (US);
Yuandong Gu, Morristown, NJ (US);
Jong Park, Morristown, NJ (US)

(73) Assignee: Honeywell International Inc., Morristown, NJ (US)

( * ) Notice: Subject to any disclaimer, the term of this patent is extended or adjusted under 35 U.S.C. 154(b) by 995 days.

(21) Appl. No.: 12/954,406

(22) Filed: Nov. 24, 2010

(65) Prior Publication Data

US 2012/0125576 A1 May 24, 2012

(51) Int. Cl.
| | |
|---|---|
| F28F 7/00 | (2006.01) |
| H05K 7/20 | (2006.01) |
| F28F 3/12 | (2006.01) |
| F28F 3/04 | (2006.01) |
| F28F 13/02 | (2006.01) |
| B21D 39/06 | (2006.01) |

(52) U.S. Cl.
CPC .............. *H05K 7/20563* (2013.01); *F28F 3/12* (2013.01); *F28F 3/044* (2013.01); *F28F 13/02* (2013.01)
USPC ....................... 165/80.3; 29/890.039; 165/170

(58) Field of Classification Search
CPC ..... H01L 23/467; H01L 23/4735; F28F 3/12; F28F 3/044; F28F 13/02; H05K 7/20572; H05K 7/20563
USPC ......... 165/80.3, 168, 169, 170, 110; 361/692, 361/693; 29/890.03, 890.13, 890.039; 72/352
See application file for complete search history.

(56) References Cited

U.S. PATENT DOCUMENTS

| | | | | |
|---|---|---|---|---|
| 4,749,298 | A | * | 6/1988 | Bundt et al. .................... 403/23 |
| 4,869,316 | A | * | 9/1989 | Yoshida et al. ................ 165/151 |
| 4,887,663 | A | * | 12/1989 | Auxier et al. .................. 165/47 |
| 5,388,765 | A | * | 2/1995 | Hill et al. ..................... 239/127.3 |
| 5,673,585 | A | * | 10/1997 | Bishop .......................... 72/447 |
| 6,538,885 | B1 | * | 3/2003 | Azar ............................. 361/695 |
| 7,284,596 | B2 | * | 10/2007 | Larson ......................... 165/80.3 |
| 8,033,119 | B2 | * | 10/2011 | Liang ............................ 60/806 |
| 2008/0062639 | A1 | * | 3/2008 | Campbell et al. ............ 361/689 |
| 2009/0288807 | A1 | | 11/2009 | Yang et al. |

* cited by examiner

*Primary Examiner* — Tho V Duong
(74) *Attorney, Agent, or Firm* — Brooks, Cameron & Huebsch, PLLC

(57) ABSTRACT

Entrainment heat sink devices and methods of forming entrainment heat sink devices are described herein. One or more method embodiments include forming an opening through a first material, forming a dimple having a trapezoidal-cross section in the first material such that the opening is located on a side wall of the trapezoidal cross-section, and attaching the first material to a second material, wherein the first material or the second material has a trench formed therein and the first material is attached to the second material such that the trench is in fluidic communication with the dimple.

14 Claims, 4 Drawing Sheets

ENTRAINMENT HEAT SINK DEVICES

GOVERNMENT RIGHTS

The subject matter of this disclosure was made with government support under Contract No.: W31PQ4-09-C-0042 awarded by DARPA/AMCOM. Accordingly, the U.S. Government has certain rights to subject matter disclosed herein:

TECHNICAL FIELD

The present disclosure relates to entrainment heat sink devices, and methods of forming entrainment heat sink devices.

BACKGROUND

A system, such as, for example, an electronic system (e.g., an avionic system with densely packed printed board assemblies) may include a number of components (e.g., heat sources) that may create unwanted heat within the system. The created heat may raise the temperature of the system above the operating temperature of the system, which may adversely affect the performance and/or longevity of the system.

Convective cooling methods may be used to dissipate the unwanted heat created by a heat source(s) in a system such as an electronic system. For example, the system may include a number of blowers and/or fans in proximity with the heat source(s). The blowers and/or fans may dissipate the unwanted heat created by the heat source(s) (e.g., cool the system) by moving air through the system. For instance, the blowers and/or fans may draw cooler, ambient air into the system and/or expel the heated air from the system.

The blowers and/or fans, however, may be large and/or bulky. Accordingly, the blowers and/or fans may increase the size and/or bulkiness of the system. Further, in some instances, blowers and/or fans may be too large and/or bulky to fit within a particular system (e.g., a particular electronic system).

Conductive cooling methods may also be used to dissipate the unwanted heat created by a heat source(s) in a system such as an electronic system. For example, the system may include a number of conductive heat sinks (e.g., solid metal plates). The conductive heat sinks may dissipate the unwanted heat created by the heat source(s) (e.g., cool the system) by transferring the unwanted heat from the heat source(s) to a fluid medium (e.g., air). For instance, the conductive heat sinks may be coupled to the heat source(s) and transfer the unwanted heat from the heat source(s) to the ambient air proximate the conductive heat sinks.

The conductive heat sinks, however, may be heavy. Accordingly, the conductive heat sinks may increase the weight of the system. Additionally, the conductive heat sinks may have a limited performance capacity. That is, the conductive heat sinks may not effectively dissipate the heat created by the heat source(s).

DETAILED DESCRIPTION

Figure 1A:
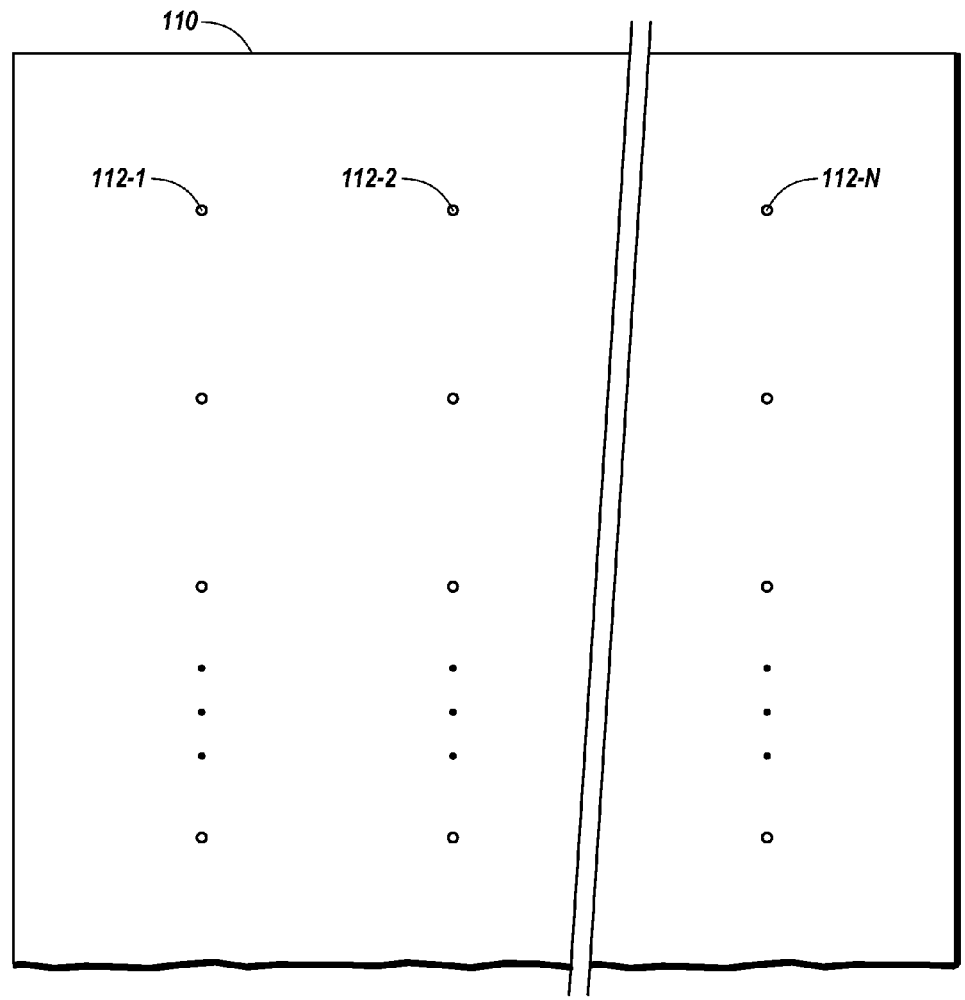
FIGS. 1A-1F illustrate process steps associated with forming an entrainment heat sink device in accordance with one or more embodiments of the present disclosure.

Entrainment heat sink devices and methods of forming entrainment heat sink devices are described herein. One or more method embodiments include forming an opening through a first material, forming a dimple having a trapezoidal-cross section in the first material such that the opening is located on a side wall of the trapezoidal cross-section, and attaching the first material to a second material, wherein the first material or the second material has a trench formed therein and the first material is attached to the second material such that the trench is in fluidic communication with the dimple.

Entrainment heat sink devices formed in accordance with one or more embodiments of the present disclosure may be smaller and/or less bulky than previous convective cooling devices (e.g., blowers and/or fans). Accordingly, systems, such as, for example, electronic systems (e.g., avionic systems with densely packed printed board assemblies) that include entrainment heat sink devices formed in accordance with one or more embodiments of the present disclosure may be smaller and/or less bulky than systems that include previous convective cooling devices. Additionally, entrainment heat sink devices formed in accordance with one or more embodiments of the present disclosure may be able to fit within systems (e.g., electronic systems) within which previous convective cooling devices may not fit.

Additionally, entrainment heat sink devices formed in accordance with one or more embodiments of the present disclosure may be lighter than previous conductive cooling devices (e.g., conductive heat sinks). Accordingly, systems (e.g., electronic systems) that include entrainment heat sink devices formed in accordance with one or more embodiments of the present disclosure may be lighter than systems that include previous conductive cooling devices. Further, entrainment heat sink devices formed in accordance with one or more embodiments of the present disclosure may have a greater performance capacity (e.g., dissipate heat more effectively and/or dissipate a greater amount of heat) than previous conductive cooling devices.

In the following detailed description, reference is made to the accompanying drawings that form a part hereof. The drawings show by way of illustration how one or more embodiments of the disclosure may be practiced. These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present invention, and should not be taken in a limiting sense.

As used herein, "a" or "a number of" something can refer to one or more such things. For example, "a number of openings" can refer to one or more openings. Additionally, the designator "N" as used herein, particularly with respect to reference numerals in the drawings, indicates that a number of the particular feature so designated can be included with a number of embodiments of the present disclosure.

FIGS. 1A-1F illustrate process steps associated with forming an entrainment heat sink device in accordance with one or more embodiments of the present disclosure. FIG. 1A illustrates a schematic top view of a material 110. A number of openings 112-1, 112-2, . . . , 112-N can be formed through material 110, as shown in FIG. 1A.

Material 110 can be, for example, a metal material such as a copper or silicon material (e.g., a copper or silicon foil), a graphite material, a ceramic material, a polymer material, or a composite material. Material 110 can have a thickness (e.g., a distance from top to bottom) of approximately 100 micrometers (μm), a length of approximately 1 inch, and a width of approximately 4 inches. However, embodiments of the present disclosure are not limited to a particular type of material or particular dimensions for material 110.

Openings 112-1, 112-2, . . . 112-N can be formed, for example, using electric discharge machining (EDM). However, embodiments of the present disclosure are not limited to a particular method for forming openings 112-1, 112-2, . . . , 112-N. For example, openings 112-1, 112-2, . . . , 112-N can also be formed using chemical etching, laser cutting, sandblasting, water jet cutting, ultrasonic drilling, and/or micro milling/drilling machines.

Openings 112-1, 112-2, . . . 112-N can have diameters of approximately 20 to 50 μm. In the embodiment illustrated in FIG. 1A, openings 112-1, 112-2, . . . , 112-N each have approximately the same diameter. However, embodiments of the present disclosure are not so limited, e.g., in some embodiments, different openings can have different diameters.

As shown in FIG. 1A, openings 112-1, 112-2, . . . , 112-N can be formed through material 110 such that an array of openings are formed through material 110. That is, openings 112-1, 112-2, . . . 112-N can be formed through material 110 such that a number of horizontal rows of openings and a number of vertical columns of openings are formed through material 110, as illustrated in FIG. 1A.

The openings in a row of the array can each be spaced apart by, for example, approximately 7 millimeters (mm), and the openings in a column of the array can each be spaced apart by, for example, approximately 6 mm. In the embodiment illustrated in FIG. 1A, the openings in each row and column are each spaced apart by approximately the same distance. However, embodiments of the present disclosure are not so limited, e.g., in some embodiments, different openings in a row and/or different openings in a column can be spaced apart by different distances.

Figure 1B:
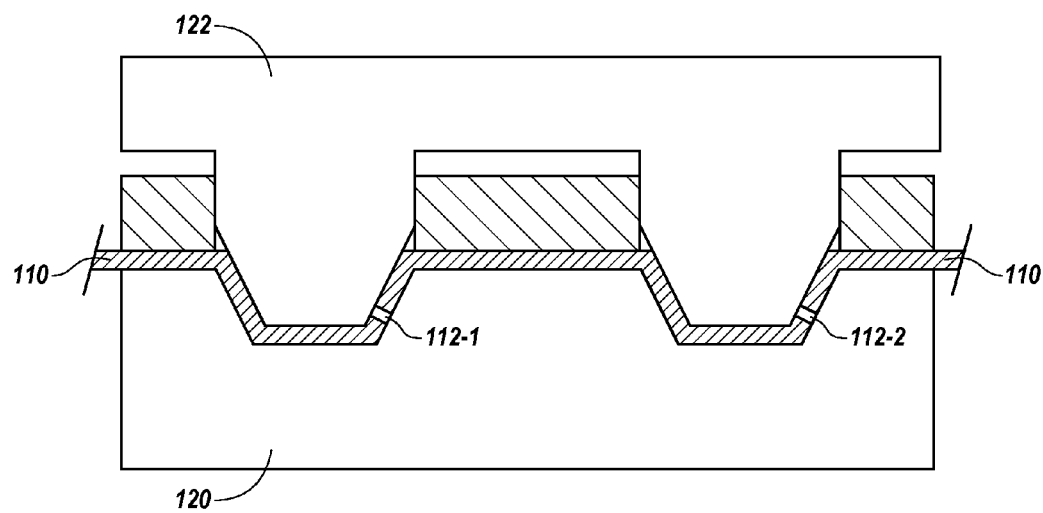

FIG. 1B illustrates a schematic cross-sectional view of a portion of the structure shown in FIG. 1A during a subsequent processing step. As shown in FIG. 1B, material 110 is placed in a mold 120. For simplicity, only a portion of the structure shown in FIG. 1A is illustrated in FIG. 1B, e.g., the portion of material 110 that includes openings 112-1 and 112-2.

Mold 120 can be, for example, a steel mold. Additionally, mold 120 can be a trapezoidal mold (e.g., a mold having a number of dimples with trapezoidal cross-sections), as illustrated in FIG. 1B.

The side walls of the dimples in mold 120 can be slanted at an angle of approximately 5 to 30 degrees from vertical. In the embodiment illustrated in FIG. 1B, the side walls of each dimple in mold 120 are each slanted at approximately the same angle from vertical. However, embodiments of the present disclosure are not so limited, e.g., in some embodiments, the side walls of different dimples in mold 120 can be slanted at different angles from vertical.

As shown in FIG. 1B, while material 110 is in mold 120, pressure can be applied to a portion of material 110 that includes opening 112-1, a portion of material 110 that includes opening 112-2, etc. For example, mechanical pressure can be applied to a portion of material 110 that includes opening 112-1, a portion of material 110 that includes opening 112-2, etc., by a stamping mechanism 122 while material 110 is in mold 120, as illustrated in FIG. 1B. That is, mechanical pressure can be applied to a portion of material 110 that includes opening 112-1, a portion of material 110 that includes opening 112-2, etc., by stamping the portion of material 110 that includes openings 112-1, the portion of material 110 that includes opening 112-2, etc., with stamping mechanism 122 in mold 120, as illustrated in FIG. 1B. Stamping mechanism 122 can be a trapezoidal stamping mechanism (e.g., a stamping mechanism having a number of stamps with trapezoidal cross-sections), as illustrated in FIG. 1B.

Embodiments of the present disclosure, however, are not limited to applying mechanical pressure to a portion of material 110 that includes opening 112-1, a portion of material 110 that includes opening 112-2, etc. For example, hydraulic and/or pneumatic pressure can be applied to a portion of material 110 that includes opening 112-1, a portion of material 110 that includes opening 112-2, etc.

Applying the pressure to a portion of material 110 that includes opening 112-1, a portion of material 110 that includes opening 112-2, etc., while material 110 is in mold 120 can form a number of dimples (e.g., dimples having a trapezoidal cross-section) in material 110, as illustrated in FIG. 1B and further described herein. Additionally, material 110 can be placed in mold 120 such that openings 112-1, 112-2, etc., are located on the side walls of the formed dimples, as illustrated in FIG. 1B and further described herein. In the embodiment illustrated in FIG. 1B, material 110 is placed in mold 120 such that openings 112-1, 112-2, etc., are located at approximately the same position on each side wall of each formed dimple. However, embodiments of the present disclosure are not so limited, e.g., in some embodiments, material 110 can be placed in mold 120 such that different openings are located at different positions on the side walls, as will be further described herein.

Figure 1C:
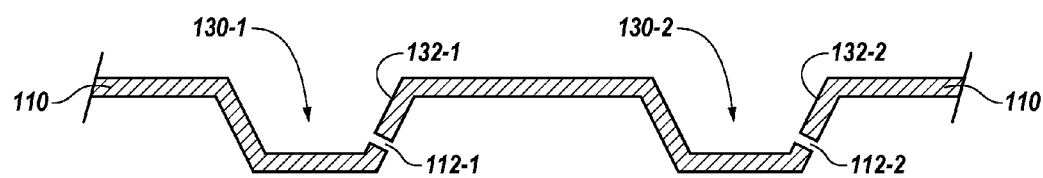
Figure 1D:
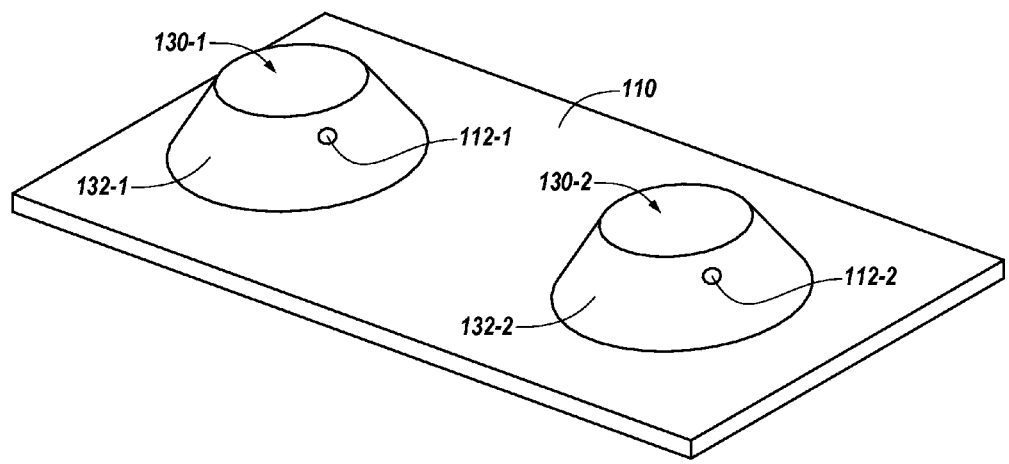

FIGS. 1C and 1D illustrate a schematic cross-sectional view and a schematic perspective view, respectively, of the structure shown in FIG. 1B after the processing step previously described in connection with FIG. 1B. That is, FIGS. 1C and 1D illustrate a schematic cross-sectional view and a schematic perspective view, respectively, of a portion of material 110 after applying pressure to a portion of material 110 that includes opening 112-1, a portion of material 110 that includes opening 112-2, etc., in the manner previously described in connection with FIG. 1B.

As shown in FIGS. 1C and 1D, a number of dimples (e.g., dimples 130-1, 130-2, etc.) having trapezoidal cross-sections are formed in material 110. In the embodiments illustrated in FIGS. 1C and 1D, dimples 130-1, 130-2, etc. have trapezoidal cross-sections in the shape of a frustum (e.g., a truncated cone). However, embodiments of the present disclosure are not so limited, and can include dimples having trapezoidal cross-sections of any shape. That is, embodiments of the present disclosure can include dimples of any shape that can produce a trapezoidal-cross section.

Each dimple 130-1, 130-2, etc., (e.g., each trapezoidal cross-section of each dimple 130-1, 130-2, etc.) formed in material 110 includes a side wall (e.g., side walls 132-1, 132-2, etc.). For example, as shown in FIGS. 1C and 1D, dimple 130-1 includes side wall 132-1, dimple 130-2 includes side wall 132-2, etc. Additionally, each opening 112-1, 112-2, . . . 112-N through material 110 is located on a side wall of a dimple (e.g., on a side wall of a trapezoidal cross-section of a dimple). For example, as shown in FIGS. 1C and 1D, opening 112-1 is located on side wall 132-1 of dimple 130-1, opening 112-2 is located on side wall 132-2 of dimple 130-2, etc.

Side walls 132-1, 132-2, etc., can be slanted at an angle of approximately 5 to 30 degrees from vertical. In the embodiment illustrated in FIGS. 1C and 1D, side walls 132-1, 132-2, etc., are each slanted at approximately the same angle from vertical. Side walls 132-1, 132-2, etc., can be slanted at approximately the same angle from vertical by, for example, forming dimples 130-1, 130-2, etc., in material 110 using a steel mold (e.g., steel mold 120) having dimples with side walls that are slanted at approximately the same angle from vertical, as previously described herein.

Embodiments of the present disclosure, however, are not so limited, e.g., in some embodiments, the side walls of different dimples in material 110 can be slanted at different angles from vertical. The side walls of different dimples in material 110 can be slanted at different angles from vertical by, for example, forming the dimples in material 110 using a steel mold having dimples with side walls that are slanted at different angles from vertical, as previously described herein.

Additionally, in the embodiment illustrated in FIGS. 1C and 1D, openings 112-1, 112-2, etc., are located at approximately the same position on side walls 132-1, 132-2, etc., of dimples 130-1, 130-2. That is, openings 112-1, 112-2, etc., are located at approximately the same height on side walls 132-1, 132-2, etc., and face approximately the same direction, as illustrated in FIGS. 1C and 1D. Openings 112-1, 112-2, etc., can be located at approximately the same position on side walls 132-1, 132-2, etc., by, for example, forming openings 112-1, 112-2, etc., in material 110 such that openings 112-1, 112-2, etc., are spaced apart by approximately the same distance and by placing material 110 in steel mold 120, as previously described herein.

Embodiments of the present disclosure, however, are not so limited, e.g., in some embodiments, different openings can be located at different positions on their respective side walls. That is, in some embodiments, different openings can be located at different heights on their respective side walls and/or face different directions. Different openings can be located at different positions on their respective side walls by, for example, forming the openings in material 110 such that different openings are spaced apart by different distances, as previously described herein. Additionally and/or alternatively, different openings can be located at different positions on their respective side walls by altering the placement of material 110 in steel mold 120, as previously described herein.

Further, in the embodiment illustrated in FIGS. 1C and 1D, each dimple 130-1, 130-2, etc., includes one opening on its respective side wall. That is, dimple 130-1 includes opening 112-1 on side wall 132-1, dimple 130-2 includes opening 112-2 on side wall 132-2, etc. Each dimple 130-1, 130-2, etc. can include one opening on its respective side wall by, for example, forming openings 112-1, 112-2, etc., in material 110 and placing material 110 in steel mold 120, as previously described herein.

Embodiments of the present disclosure, however, are not so limited, e.g., in some embodiments, each dimple 130-1, 130-2, etc., can include multiple openings on its respective side wall. For example, in some embodiments, each dimple can include two openings located opposite each other on its respective side wall. Each dimple 130-1, 130-2, etc., can include multiple openings on its respective side wall by, for example, forming additional openings in material 110 and placing material 110 in steel mold 120 such that the additional openings are also located on the side walls.

Figure 1E:
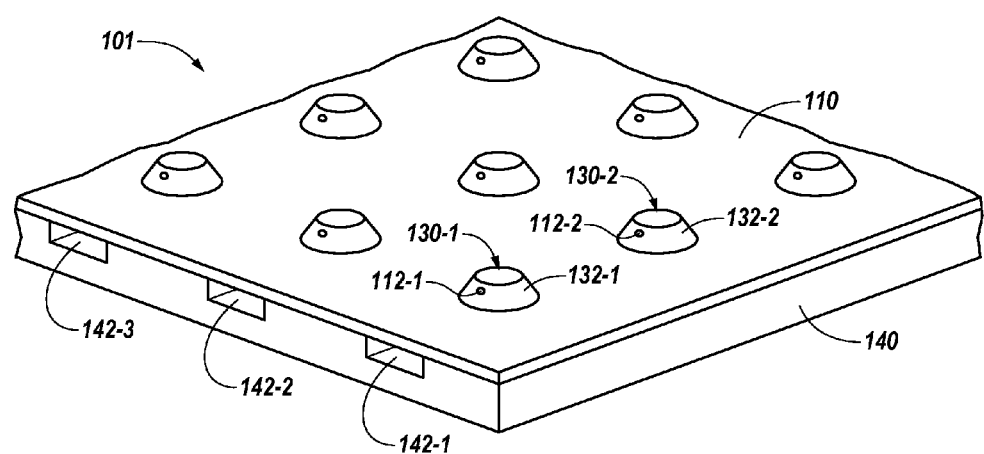

FIG. 1E illustrates a schematic perspective view of the structure shown in FIGS. 1C and 1D after a subsequent processing step. The structure illustrated in FIG. 1E can be a portion of an entrainment heat sink device 101. For simplicity, only a portion of entrainment heat sink device 101 is illustrated in FIG. 1E.

As shown in FIG. 1E, material 110 is attached to an additional material 140. Material 110 can be attached to material 140 by, for example laminating material 110 on material 140.

Material 140 can be, for example, a metal material such as a copper material (e.g., a copper plate), a graphite material, a ceramic material, a polymer material, or a composite material. Material 140 can have a thickness (e.g., a distance from top to bottom) of approximately 0.5 µm. However, embodiments of the present disclosure are not limited to a particular type of material or a particular thickness for material 140.

As shown in FIG. 1E, material 140 includes a number of trenches (e.g., channels) 142-1, 142-2, 142-3, etc., formed therein. Trenches 142-1, 142-2, 142-3, etc., can be formed for example, machining or chemical etching, among other methods.

Trenches 142-1, 142-2, 142-3, etc., can have a cross-sectional area that is, for example, approximately 10 to 20 times larger than the cross-sectional area of openings 112-1, 112-2, etc. However, embodiments of the present disclosure are not limited to a particular cross-sectional area for trenches 142-1, 142-2, 142-3, etc.

As shown in FIG. 1E, material 110 is attached to material 140 such that each dimple 130-1, 130-2, etc., is in fluidic connection with a trench 142-1, 142-2, 142-3, etc. For example, in the embodiment illustrated in FIG. 1E, entrainment heat sink device 101 includes a number of rows of dimples having trapezoidal cross-sections, and each row of dimples is in fluidic connection with a particular trench. For instance, each dimple in the row of dimples that includes dimples 130-1 and 130-2 is in fluidic connection with trench 142-1, as illustrated in FIG. 1E. That is, a fluid (e.g., air) can travel between trench 142-1 and each dimple in the row of dimples that includes dimples 130-1 and 130-2.

In one or more embodiments, compressed air can be introduced into trenches 142-1, 142-2, 142-3. etc., at the edge of entrainment heat sink device 101. The air can travel through trenches 142-1, 142-2, 142-3, etc., to dimples 130-1, 130-2, etc. That is, trenches 142-1, 142-2, 142-3, etc., can then deliver the air to dimples 130-1, 130-2, etc. For example, trench 142-1 can deliver the air to each dimple in the row of dimples that includes dimples 130-1 and 130-2. The air can then travel through openings 112-1, 112-2, etc., and along the surface of material 110. That is, openings 112-1, 112-2, etc., can then direct the air along the surface of material 110.

In the embodiment illustrated in FIG. 1E, side walls 132-1, 132-2, etc., are each slanted at approximately the same angle from vertical, openings 112-1, 112-2, etc., are located at approximately the same position on side walls 132-1, 132-2, etc., and each dimple 130-1, 130-2, etc., includes one opening on its respective side wall, as previously described herein. Accordingly, openings 112-1, 112-2, etc., can direct air along the surface of material 110 at approximately the same angle and in approximately the same direction.

Embodiments of the present disclosure, however, are not so limited. For example, in some embodiments, the side walls of different dimples can be slanted at different angles from vertical, different openings can be located at different positions on their respective side walls, and/or different dimples can include different numbers of openings on their respective side walls, as previously described herein. In such embodiments, different openings can direct air along the surface of material 110 at different angles and/or in different directions.

Figure 1F:
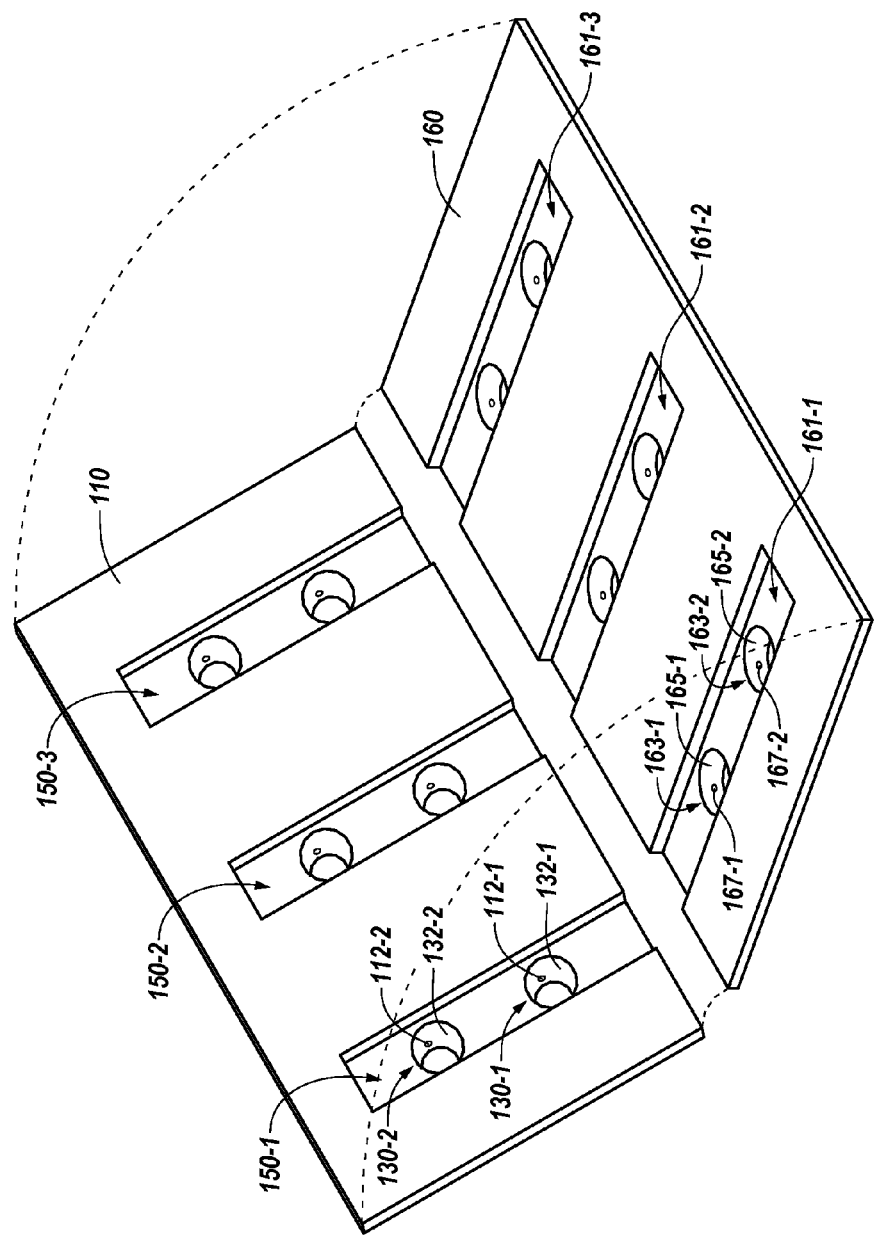

FIG. 1F illustrates a schematic perspective view of the structure shown in FIGS. 1C and 1D after a subsequent processing step that is an alternative processing step to the processing step previously described in connection with FIG. 1E.

That is, the structure illustrated in FIG. 1F can be formed into an entrainment heat sink device that is an alternative entrainment heat sink device to entrainment heat sink device 101 previously described in connection with FIG. 1E.

In the embodiment illustrated in FIG. 1F, a number of trenches (e.g., trenches 150-1, 150-2, 150-3, etc.) are formed in material 110. Trenches 150-1, 150-2, 150-3, etc., can be formed for example, machining or chemical etching, among other methods.

Trenches 150-1, 150-2, 150-3, etc., can have a cross-sectional area that is, for example, approximately 10 to 20 times larger than the cross-sectional area of openings 112-1, 112-2, etc. However, embodiments of the present disclosure are not limited to a particular cross-sectional area for trenches 150-1, 150-2, 150-3, etc.

As shown in FIG. 1F, trenches 150-1, 150-2, 150-3, etc., are formed in material 110 such that each dimple 130-1, 130-2, etc., is in fluidic connection with a trench 150-1, 150-2, 150-3, etc. For example, the embodiment illustrated in FIG. 1F includes a number of rows of dimples having trapezoidal cross-sections, and each row of dimples is in fluidic connection with a particular trench. For instance, each dimple in the row of dimples that includes dimples 130-1 and 130-2 is in fluidic connection with trench 150-1, as illustrated in FIG. 1F. That is, a fluid (e.g., air) can travel between trench 150-1 and each dimple in the row of dimples that includes dimples 130-1 and 130-2.

The embodiment illustrated in FIG. 1F also includes an additional material 160. For simplicity, only a portion of additional material 160 is shown in FIG. 1F.

As shown in FIG. 1F, material 160 includes a number of trenches (e.g., trenches 161-1, 161-2, 161-3, etc.) and a number of dimples (e.g., dimples 163-1, 163-2, etc.) having trapezoidal cross-sections formed therein. Each dimple 163-1, 163-2, etc., (e.g., each trapezoidal cross-section of each dimple 163-1, 163-2, etc.) includes a side wall (e.g., side walls 165-1, 165-2, etc.) having an opening (e.g., openings 167-1, 167-2, etc.) located thereon, as shown in FIG. 1F. Material 160, trenches 161-1, 162-2, 162-3, etc., dimples 163-1, 163-2, etc., side walls 165-1, 165-2, etc., and openings 167-1, 167-2, etc., can be analogous to material 110, trenches 150-1, 150-2, 150-3, etc., dimples 130-1, 130-2, etc., side walls 132-1, 132-2, etc., and openings 112-1, 112-2, etc., respectively, previously described herein. That is, trenches 161-1, 161-2, 161-3, etc., dimples 163-1, 163-2, etc., side walls 165-1, 165-2, etc., and openings 167-1, 167-2, etc., can be formed in material 160 in a manner analogous to the manner in which trenches 150-1, 150-2, 150-3, etc., dimples 130-1, 130-2, etc., side walls 132-1, 132-2, etc., and openings 112-1, 112-2, etc., respectively, are formed in material 110 previously described herein.

An entrainment heat sink device can be formed by attaching material 110 to material 160, as illustrated in FIG. 1F. Material 110 can be attached to material 160 by, for example laminating material 110 on material 160.

Material 110 can be attached to material 160 such that each trench in material 110 is adjacent a trench in material 160. For example, material 110 can be attached to material 160 such that trench 150-1 is adjacent trench 161-1, trench 150-2 is adjacent trench 161-2, trench 150-3 is adjacent 161-3, etc.

Adjacent trenches can form channels (e.g., air channels) in the entrainment heat sink device. For example, trenches 150-1 and 161-1 can form a first channel, trenches 150-2 and 161-2 can form a second channel, trenches 150-3 and 161-2 can form a third channel, etc.

In one or more embodiments, compressed air can be introduced into the channels formed by the adjacent trenches at the edge of the entrainment heat sink device. The air can travel through the channels to dimples 130-1, 130-2, etc., and 163-1, 163-2, etc. That is, the channels can then deliver the air to dimples 130-1, 130-2, etc., 163-1, 163-2, etc. For example, the channel formed by trenches 150-1 and 161-1 can deliver the air to each dimple in the row of dimples that includes dimples 130-1 and 130-2, and each dimple in the row of dimples that includes dimples 163-1 and 163-2. The air can then travel through openings 112-1, 112-2, etc., and 167-1, 167-2, etc., and along the surfaces of materials 110 and 160. That is, openings 112-1, 112-2, etc., and 167-1, 167-2, etc., can then direct the air along the surfaces of materials 110 and 160, respectively.

In the embodiment illustrated in FIG. 1F, side walls 132-1, 132-2, etc., and 165-1, 165-2, etc., are each slanted at approximately the same angle from vertical, openings 112-1, 112-2, etc., and 167-1, 167-2, etc., are located at approximately the same position on side walls 132-1, 132-2, etc., and 165-1, 165, respectively, and each dimple 130-1, 130-2, etc., and 163-1, 163-2, etc., includes one opening on its respective side wall, as previously described herein. Accordingly, openings 112-1, 112-2, etc., and 167-1, 167-2, etc., can direct air along the surfaces of materials 110 and 160, respectively at approximately the same angle and in approximately the same direction.

Embodiments of the present disclosure, however, are not so limited. For example, in some embodiments, the side walls of different dimples can be slanted at different angles from vertical, different openings can be located at different positions on their respective side walls, and/or different dimples can include different numbers of openings on their respective side walls, as previously described herein. In such embodiments, different openings can direct air along the surface of materials 110 and/or 160 at different angles and/or in different directions.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method of forming an entrainment heat sink device, comprising:
   forming an opening through a first material and an opening through a second material;
   forming a dimple having a trapezoidal cross-section in the first material and a dimple having a trapezoidal cross-section in the second material such that the opening through the first material is located on a side wall of the trapezoidal cross-section in the first material and the opening through the second material is located on a side wall of the trapezoidal cross-section in the second material; and
   attaching the first material to a second material, wherein:
      the first material has a first trench formed therein and the second material has a second trench formed therein such that the dimple in the first material is in fluidic communication with the first trench and the dimple in the second material is in fluidic communication with the second trench; and
      the first material is attached to the second material such that the first trench is adjacent the second trench.

2. The method of claim 1, wherein forming the dimple in the first material includes applying pressure to a portion of the first material that includes the opening through the first material.

3. The method of claim 2, wherein applying pressure to the portion of the first material that includes the opening through the first material includes stamping the portion of the first material that includes the opening through the first material in a trapezoidal steel mold.

4. The method of claim 1, wherein the method includes forming the dimple in the first material such that the side wall of the trapezoidal cross-section in the first material is slanted at an angle of approximately 5 to 30 degrees from vertical.

5. The method of claim 1, wherein the opening through the first material is a first opening and wherein the method includes:
   forming an additional opening through the first material; and
   forming the dimple in the first material such that the additional opening is located on the side wall of the trapezoidal cross-section in the first material.

6. The method of claim 5, wherein the additional opening is located on the side wall of the trapezoidal cross-section in the first material opposite the first opening through the first material.

7. The method of claim 1, wherein the opening through the first material has a diameter of approximately 20 to 50 micrometers.

8. A method of forming an entrainment heat sink device, comprising:
   forming a number of openings through a first material and a number of openings through a second material;
   forming a number of dimples having trapezoidal cross-sections in the first material and a number of dimples having trapezoidal cross-sections in the second material such that each opening through the first material is located on a side wall of a trapezoidal cross-section of a dimple in the first material and each opening through the second material is located on a side wall of a trapezoidal cross-section of a dimple in the second material;
   forming a first trench in the first material and a second trench in the second material such that each dimple in the first material is in fluidic connection with the first trench and each dimple in the second material is in fluidic connection with the second trench; and
   attaching the first material to the second material such that the first trench is adjacent the second trench.

9. The method of claim 8, wherein the method includes forming an array of openings through the first material and an array of openings through the second material.

10. The method of claim 8, wherein the method includes forming the number of dimples in the first material and the number of dimples in the second material such that each side wall of the trapezoidal cross-sections of the dimples in the first material and each side wall of the trapezoidal cross-sections of the dimples in the second material are slanted at approximately a same angle from vertical.

11. The method of claim 8, wherein the method includes:
   forming the number of dimples in the first material such that at least two side walls of the trapezoidal cross-sections of the dimples in the first material are slanted at different angles from vertical; and
   forming the number of dimples in the second material such that at least two side walls of the trapezoidal cross-sections of the dimples in the second material are slanted at different angles from vertical.

12. The method of claim 8, wherein the method includes forming the number of dimples in the first material and the number of dimples in the second material such that each opening through the first material and each opening through the second material are located at approximately a same position on each side wall of each trapezoidal cross-section of each dimple in the first material and each side wall of each trapezoidal cross-section of each dimple in the second material.

13. The method of claim 8, wherein the method includes:
   forming the number of dimples in the first material such that at least two openings through the first material are located at different positions on their respective side walls of their respective trapezoidal cross-sections of their respective dimples in the first material; and
   forming the number of dimples in the second material such that at least two openings through the second material are located at different positions on their respective side walls of their respective trapezoidal cross-sections of their respective dimples in the second material.

14. The method of claim 8, wherein the method includes forming the number of openings through the first material and the number of openings through the second material using electric discharge machining.

* * * * *